United States Patent [19]
Yang

[11] Patent Number: 5,661,625
[45] Date of Patent: Aug. 26, 1997

[54] CIRCUIT DEVICE FOR UNSTABLE POWER SOURCE TRANSIENT STATE COMPENSATION AND LOW VOLTAGE CUTOFF PROTECTION OF AN ACTIVE CONTROLLER COMPONENT

[76] Inventor: Tai-Her Yang, No. 32 Lane 29, Taipin St., Si-Hu Town, Dzan-Hwa, Taiwan

[21] Appl. No.: 557,622

[22] Filed: Nov. 14, 1995

[51] Int. Cl.[6] ................................................ H02H 3/24
[52] U.S. Cl. ........................................ 361/92; 361/115
[58] Field of Search ............................. 361/91–93, 115

[56] References Cited

U.S. PATENT DOCUMENTS 5,200,878  4/1993  Sasagawa ........................... 361/93

Primary Examiner—Jeffrey A. Gaffin
Assistant Examiner—Stephen W. Jackson
Attorney, Agent, or Firm—Bacon & Thomas

[57] ABSTRACT

A circuit device connected between a driving circuit for an active control component such as an IGBT or MOSFET includes a capacitor which compensates for drops in the power supply voltage to the driving circuit and a voltage limiting cut-off device which cuts-off power to the driving circuit when the power supply voltage drop continues for a period long enough to cause a drop in voltage across the capacitor.

6 Claims, 1 Drawing Sheet

CIRCUIT DEVICE FOR UNSTABLE POWER SOURCE TRANSIENT STATE COMPENSATION AND LOW VOLTAGE CUTOFF PROTECTION OF AN ACTIVE CONTROLLER COMPONENT

SUMMARY OF THE INVENTION

A circuit device which compensates for unstable power source transient voltage drops in an unstable power source and which also provides for low voltage cutoff protection of an active controller component includes a transient state capacitor device installed to provide power to the driving circuit when the power source voltage is abnormally lowered and also a voltage-limiting switching device installed to cut off power supply to the driving circuit when the voltage of the driving circuit and capacitor device is lowered continuously to thereby cut off the working status of the active controller component and avoid damaging the active controller device.

DETAILED DESCRIPTION OF THE INVENTION

Solid state transistors such as IGBT (insulated-gate bipolar transistor) or other types of power transistors are usually employed as the active controller component in the control circuits. When the power source voltage is lowered due to unstable transient behaviors or other reasons, the active controller driving circuit voltage is usually caused to drop and the active controller component is damaged due to inadequacy of driving voltage or current. This problem is addressed by the circuit device of the invention, which includes a transient state capacitor device installed to provide power to the driving circuit when the power source voltage is abnormally lowered and a voltage-limiting switching device further installed to cut off power supply to the driving circuit when the voltage of the driving circuit and capacitor device is lowered continuously to thereby cut off the working status of the active controller component and avoid damaging the active controller device.

Figure 1:
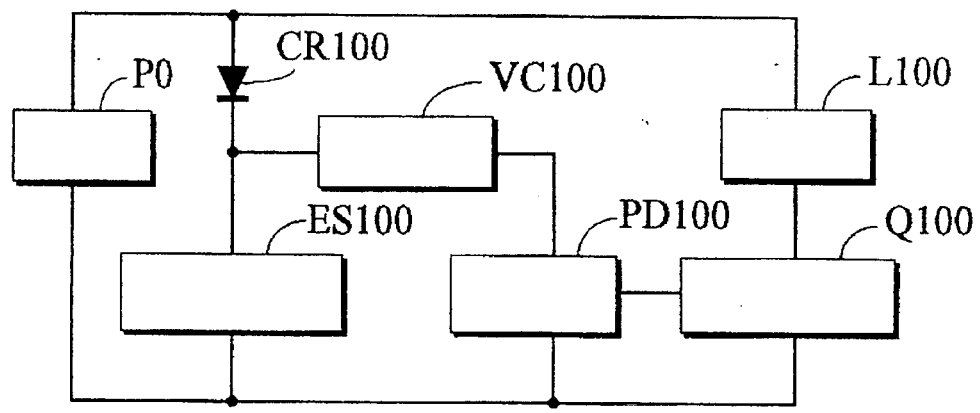
FIG. 1 is a functional block diagram of the invention.

FIG. 1 is a block diagram of a circuit device for unstable power source transient state compensation and low voltage cutoff protection of an active controller component according to the invention, which includes the following components:

A power source PO, which can be a full wave DC, half wave DC, or Pulse DC power source.

A diode CR100 for introducing power from the power source to the transient capacitor device without return.

A transient capacitor device ES100 made up of a capacitor or a dischargeable secondary cell for receiving and storing the power input from the power source PO through the diode CR100.

A voltage-limiting switching device VC100 made up of solid state or electromechanical components, and which is at low resistance conducting status when the driving circuit voltage is normal and at high resistance cutoff status when the driving circuit voltage is lower than the normal value, the voltage-limiting circuit being series installed between the transient capacitor device ES100 and the driving circuit PD100.

A driving circuit PD100 made up of solid state or electromechanical components for driving the active controller device Q100, and supplied with power by the transient capacitor device, under control of analog or digital operating commands.

A load L100 which can be a resistive or inductive load, or an electric power driven load such as an electric heater, a motor or a generator.

An active controller Q100 made up of solid state components such as power transistors or MOSFETS (metal oxide semiconductor field effect transistors) or IGBTs (insulated-gate bipolar transistors) for series installation between the power source and the load.

The circuit operates as follows:

1) When the power source PO voltage is normal, the voltage-limiting switching circuit VC100 is at a low resistance conducting status, so that the driving circuit PD100 and the active controller component Q100 operate normally.

2) When the power source PO voltage is lowered during a transient event, the power continues to be supplied from the transient capacitor device ES100 through the voltage-limiting switching device VC100 to provide output to the driving circuit PD100, so that the active controller component Q100 is still in a normal working state.

3) When the power source PO voltage is continuously too low and the power from the transient capacitor device ES100 drops to cause the driving circuit voltage to be lower than the normal voltage value, the voltage-limiting switching device VC100 is switched to the cutoff status to cut off the driving circuit PD100, so that operation of the active controller component Q100 is also cut off.

Figure 2:
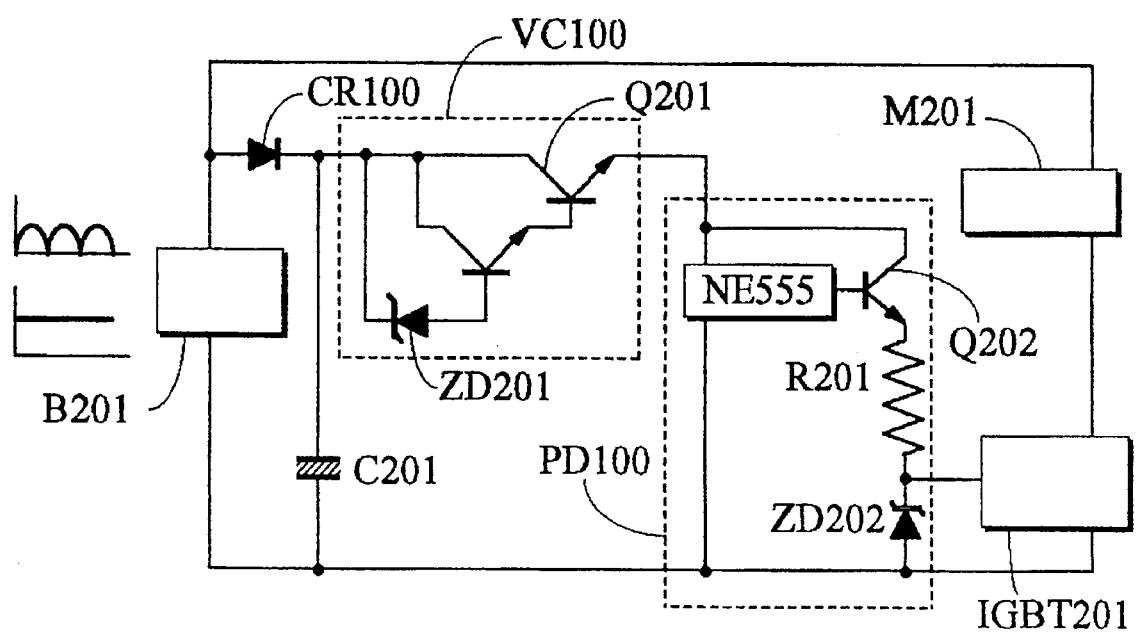
FIG. 2 is a schematic circuit diagram of a preferred embodiment of the invention applied to a DC motor controller.

FIG. 2 is a schematic circuit diagram of a preferred circuit device for unstable power source transient state compensation and low voltage cut-off protection of an active controller component in which the aforesaid power source PO is constituted by the battery B201, the aforesaid transient capacitor drive ES100 is constituted by the capacitor C201, the switching transistor Q201 is series installed between the control power source and the driving circuit PD100, a zener diode ZD201 is parallel combined between the collector electrode and base electrode of the switching transistor Q201 to constitute the aforesaid voltage-limiting switching device VC100, the aforesaid active controller component Q100 is constituted by OGBT 201, the aforesaid load L100 is constituted by a DC motor M201, and the aforesaid driving circuit PD100 is constituted by the periodic oscillator circuit NE555, transistor Q202, resistor R201 and zener diode ZD202.

I claim:

1. In a circuit having a power source connected to a load via an active controller component, the active controller component being switched by a driving circuit also connected to the power supply, the improvement comprising:

a transient capacitor device connected in parallel between the power supply and the driving circuit so as to discharge when the power supply voltage drops and thereby compensate for the drop in voltage supplied by the power supply to the driving circuit; and a voltage limiting cut-off device connected between the transient capacitor device and the driving circuit and arranged to cut-off supply of power to the driving circuit when the power supply voltage drop continues for a sufficient time to cause the voltage across the capacitor to also drop by a predetermined amount.

2. A circuit device as claimed in claim 1, wherein the capacitor device is a capacitor and the voltage limiting cut-off device includes a switching transistor, the base electrode of which is controlled by a zener diode connected to be responsive to voltage drops across the capacitor.

3. A circuit device as claimed in claim 1, wherein the active control component is an insulated gate bipolar transistor.

4. A circuit device as claimed in claim 1, further comprising a diode connected between one end of the capacitor and one terminal of the power supply.

5. A circuit device as claimed in claim 1, wherein the load is a DC motor and the driving circuit includes a periodic oscillator circuit and zener diode connected to a control electrode of the active control component to form a motor driving circuit.

6. A circuit device as claimed in claim 5, further comprising a diode connected between one end of the capacitor and one terminal of the power supply.

* * * * *